United States Patent
Li et al.

(10) Patent No.: US 11,121,319 B2
(45) Date of Patent: Sep. 14, 2021

(54) PHASE-CHANGE MEMORY WITH NO DRIFT

(71) Applicant: International Business Machines Corporation, Armonk, NY (US)

(72) Inventors: Ning Li, White Plains, NY (US); Joel P. de Souza, Putam Valley, NY (US); Stephen W. Bedell, Wappingers Falls, NY (US); Devendra K. Sadana, Pleasantville, NY (US)

(73) Assignee: international Business Machines Corporation, Armonk, NY (US)

( * ) Notice: Subject to any disclaimer, the term of this patent is extended or adjusted under 35 U.S.C. 154(b) by 26 days.

(21) Appl. No.: 16/710,069

(22) Filed: Dec. 11, 2019

(65) Prior Publication Data

US 2021/0184118 A1 Jun. 17, 2021

(51) Int. Cl.
*H01L 45/00* (2006.01)
*H01L 27/24* (2006.01)
(Continued)

(52) U.S. Cl.
CPC ...... *H01L 45/1675* (2013.01); *H01L 27/2463* (2013.01); *H01L 45/06* (2013.01);
(Continued)

(58) Field of Classification Search
CPC combination set(s) only.
See application file for complete search history.

(56) References Cited

U.S. PATENT DOCUMENTS

| 7,787,278 B2 | 8/2010 | Bae |
| 8,193,027 B2 | 6/2012 | Xiao |

(Continued)

FOREIGN PATENT DOCUMENTS

| CN | 1650419 A | 8/2005 |
| CN | 1953228 A | 4/2007 |

(Continued)

OTHER PUBLICATIONS

Wang et al., "Application of phase-change materials in memory taxonomy", Science and Technology of Advanced Materials, 2017 vol. 18, No. 1, 406-429, <https://doi.org/10.1080/14686996.2017.1332455>.

(Continued)

*Primary Examiner* — Mounir S Amer
(74) *Attorney, Agent, or Firm* — Alexander G. Jochym

(57) ABSTRACT

A bottom electrode is deposited on top of a substrate. A dielectric material layer is deposited on top of the bottom electrode. A hole is created in the dielectric material layer. A lift off layer is spun on and baked on the dielectric material layer. A photoresist layer is spun on and baked on the lift off layer. UV lithography is performed to create an opening above the hole in the dielectric material layer. An Ag layer is deposited on top of the remaining patterned dielectric material layer and the photoresist layer. A Germanium Antimony Telluride (GST) layer is deposited on top of the Ag layer. A top electrode is deposited on top of the GST layer. The Ag layer, the GST layer, and the top electrode located on top of the photoresist layer along with the photoresist layer and the lift off layer are removed.

20 Claims, 4 Drawing Sheets

(51) Int. Cl.
   *G03F 7/20*   (2006.01)
   *G03F 7/16*   (2006.01)
   *G03F 7/38*   (2006.01)

(52) U.S. Cl.
   CPC ........ *H01L 45/126* (2013.01); *H01L 45/1233* (2013.01); *H01L 45/144* (2013.01); *G03F 7/162* (2013.01); *G03F 7/2002* (2013.01); *G03F 7/38* (2013.01)

(56) References Cited

U.S. PATENT DOCUMENTS

| | | | |
|---|---|---|---|
| 8,263,455 | B2 | 9/2012 | Park |
| 8,363,463 | B2 | 1/2013 | Shih |
| 8,946,666 | B2 | 2/2015 | Cheng |
| 8,987,700 | B2 * | 3/2015 | Lai ..................... H01L 45/1233 257/4 |
| 9,171,616 | B2 | 10/2015 | Liu |
| 9,558,823 | B1 | 1/2017 | Khwa |
| 9,564,583 | B2 | 2/2017 | Aratani |
| 2006/0291364 | A1 | 12/2006 | Kozicki |
| 2008/0089120 | A1* | 4/2008 | Choi ..................... H01L 48/085 365/163 |
| 2011/0049456 | A1 | 3/2011 | Lung |

FOREIGN PATENT DOCUMENTS

| | | |
|---|---|---|
| CN | 101976726 A | 2/2011 |
| CN | 102005466 A | 4/2011 |
| CN | 108015292 A | 5/2018 |

OTHER PUBLICATIONS

Li et al., "Phase Change Material With Reduced Reset State Resistance Drift", U.S. Appl. No. 16/682,647, filed Nov. 13, 2019, 17 pages.

Appendix P—List of IBM Patents or Patent Applications Treated as Related, Filed herewith, 2 Pages.

International Search Report and Written Opinion, International Application No. PCT/IB2020/060968, International Filing Date Nov. 20, 2020, 10 Pgs.

Kumar et al, "Optical properties and phase transition in photodoped amorphousGe-Sb-Te-Ag thinfilms", © 2013 ELSEVIER B.V., Thin Solid Films vol. 540, Jun. 2013), pp. 1-6, <www.elsevier.com/locate/tsf>.

\* cited by examiner

PHASE-CHANGE MEMORY WITH NO DRIFT

FIELD OF THE INVENTION

The present invention relates generally to phase-change memory, and more particularly to the fabrication of phase-change memory with no drift.

BACKGROUND OF THE INVENTION

Phase-change memory (PCM) is a type of non-volatile random-access memory (NVRAM). Phase change memory can be referred to as PCM or PCRAM. PCM uses the unique properties of phase change materials to store information in both amorphous and crystalline phases. The materials can rapidly and repeatedly switch between the phases. This switching is often done by heating through optical pulse or electrical heating.

Information, or data, is stored in the phase of the material. This data can be read by measuring the resistance of the PCM cell. PCM can offer faster RAM speeds, but the data is stored with low power requirements.

PCM uses special alloys, including Germanium Antimony Tellurium (GST). GST can be altered with heat to have two different states or "phases" (crystalline and amorphous).

SUMMARY

Embodiments of the present invention include a method for fabricating a phase-change memory (PCM). In an embodiment, a bottom electrode is deposited on top of a substrate. A dielectric material layer is deposited on top of the bottom electrode. A hole is created in the dielectric material layer. A lift off layer is spun on and baked on the dielectric material layer. A photoresist layer is spun on and baked on the lift off layer. UV lithography is performed to create an opening above the hole in the dielectric material layer. An Ag layer is deposited on top of the remaining patterned dielectric material layer and the photoresist layer. A Germanium Antimony Telluride (GST) layer is deposited on top of the Ag layer. A top electrode is deposited on top of the GST layer. The Ag layer, the GST layer, and the top electrode located on top of the photoresist layer along with the photoresist layer and the lift off layer are removed.

DETAILED DESCRIPTION

Figure 1A:
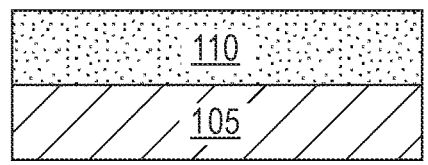
FIGS. 1A, 1B, 1C, 1D, 1E, 1F, and 1G are a pictorial representation (through a cross-sectional view) depicting a structure including an Ag and GST layer, in accordance with a first embodiment of the present invention.

Embodiments of the present invention generally provide a method for fabricating a phase-change memory (PCM). Specifically, embodiments of the present invention provide for a multi-layer stack of Ag and Germanium Antimony Telluride (GST) by physical deposition techniques including evaporation and sputtering to minimize reset resistance drift in phase change memory structure.

Embodiments of the present invention realize that a detrimental resistance drift exists in phase-change materials. In general, the resistance of the phase-change materials should remain constant over time. Unfortunately, this resistance drift destroys the stability of the phase-change memory and limits the development. Specifically, embodiments of the present invention reduce resistance drift in phase-change materials through depositing different layers of Ag and GST between top and bottom electrodes.

The Applicant of the present application has unexpectedly determined that the presence of a multilayer structure of silver (Ag) and $Ge_2Sb_2Te_5$ (GST) as a PCM material can reduce the reset state resistance drift of a PCM cell as compared to an equivalent PCM cell in which a non-Ag doped GST alloy layer is used. The term "multilayer structure of Ag and $Ge_2Sb_2Te_5$ (GST)" is used throughout the present application to denote a GST alloy in which Ag is present as an intentionally added impurity. The migration of Ag in GST during the deposition as well as during set and reset operation minimizes the resistance drift in the reset state.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term non-crystalline refers to amorphous, nano-crystalline or micro-crystalline.

The term crystalline refers to single-crystalline (i.e., mono-crystalline) or poly-crystalline (i.e., multi-crystalline).

A typical PCM cell includes a material stack of a first electrode, a PCM material that exhibits a change in atomic order (from crystalline to amorphous, or vice versa), and a second electrode. For example, a PCM material composed of a germanium antimony tellurium ($Ge_2Sb_2Te_5$ or GST) alloy in the crystalline state presents a low resistance (i.e., the set state), while in the amorphous state a GST alloy presents a high resistance (i.e., reset state). In typical PCMs cells, the first and second electrodes are composed of a conductive material such as, for example, titanium nitride (TiN) or tungsten (W), while the PCM material is composed of a chalcogenide (i.e., a material that includes an element from Group 16 of the Periodic Table of Elements and a more electropositive element). Typically, a chalcogenide that provides the PCM material is GST.

Reference is now made to FIGS. 1A-1G, which illustrate a first method of forming a phase-change memory, in accordance with a first embodiment of the present invention. In the first method, an Ag layer is first deposited followed by a GST layer in a patterned dielectric material layer between a top electrode and a bottom electrode. Referring to FIGS. 1A-1F, there is a pictorial representation (through a cross-sectional view) depicting a memory structure including a substrate 105, a bottom electrode 110, a patterned dielectric layer 115, an Ag layer 120, a GST layer 130, and a top electrode 140.

In the first embodiment, FIG. 1A depicts the first layer of the memory structure, the substrate 105 with a bottom electrode 110 located on top of the substrate 105. In the first embodiment, substrate 105 is composed of conducting, non-conducting or semiconductor material (such as, for example, silicon). The bottom electrode 110 is composed of a first conductive material. The first conductive material that provides the bottom electrode 110 can be a conductive metal, or a conductive metal nitride. In one embodiment of the present application, the bottom electrode 110 can be composed of titanium nitride (TiN), tantalum nitride (TaN) or tungsten (W). The bottom electrode 110 can have a thickness from 10 nm to 100 nm; although other thicknesses for the bottom electrode 110 are contemplated and can be employed in the present application. The bottom electrode 110 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 1B:
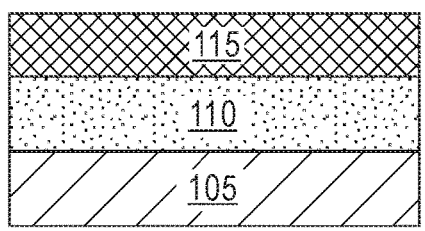

In the first embodiment, FIG. 1B depicts a blanket dielectric material layer 115 such as, for example, silicon dioxide or silicon nitride. The blanket dielectric material layer 115 can have a thickness from 10 nm to 100 nm; although other thicknesses for the blanket dielectric material layer 115 are contemplated and can be employed in the present application. The blanket dielectric material layer 115 can be formed by a deposition process including, for example, chemical vapor deposition (CVD), plasma enhanced chemical vapor deposition (PECVD), atomic layer deposition (ALD), physical vapor deposition (PVD) or sputtering.

Figure 1C:
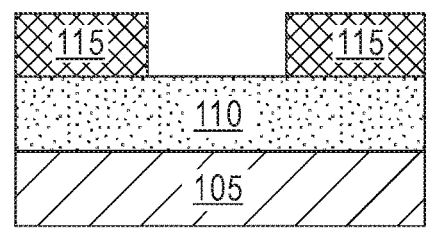

In the first embodiment, FIG. 1C depicts dielectric material layer 115 of FIG. 1B that includes a hole of 1 micron or less of lateral dimension that is now referred to as the patterned dielectric material layer 115 that allows a layer to be placed on top of the patterned dielectric material layer 115 and this layer placed on top can be in contact with the bottom electrode 110. In an embodiment, there may be a single hole in the patterned dielectric material layer 115. In an alternative embodiment, there may be more than one hole in the patterned dielectric material layer 115. In yet another alterative embodiment, any of the holes may be located anywhere in the patterned dielectric material layer 115. In an embodiment, the holes are created by optical or electron beam lithography and etched by reactive plasma etching or ion beam sputtering.

Figure 1D:
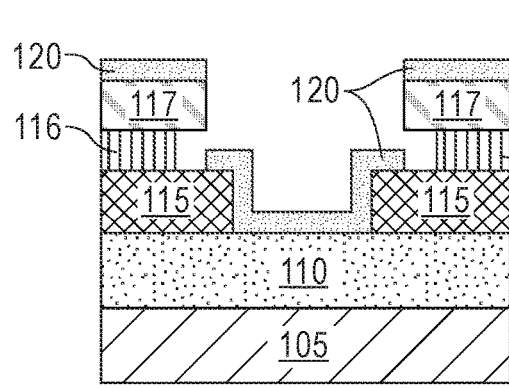

In the first embodiment, FIG. 1D a lift off pattern is first created (layers 116 and 117) by lithographic exposure and development. The structure of FIG. 1D depicts an Ag layer 120 that is deposited on top of the patterned dielectric material layer 115 and the exposed layer of the bottom electrode 110 and is in direct contact with the bottom electrode 110. In an embodiment, the Ag layer 120 has a thickness less than 20 nanometers (nm). In an alternative embodiment, the Ag layer 120 has a thickness between 5 nm and 10 nm. In an embodiment, the Ag layer 120 is deposited on the patterned dielectric material layer 115 using thermal evaporation. In an embodiment, a lift off layer 116 and a photoresists layer 117 are used in order to cover the patterned dielectric material layer 115 but expose the hole and an area around the hole in the patterned dielectric material layer 115 to the Ag layer 120 but does not allow for the entire remaining patterned dielectric material layer 115 to be covered in the Ag layer 120. In an embodiment, the lift off layer 116 and photoresist layer 117 are spin-on and baked. In an embodiment, the hole or holes are made by exposing UV light through a mask with the pattern aligned to the hole or holes in the patterned dielectric layer and the lift off layer 116 is undercut by the developer.

Figure 1E:
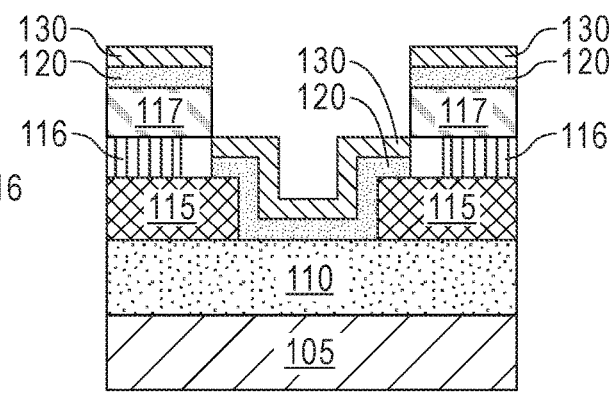
Figure 1F:
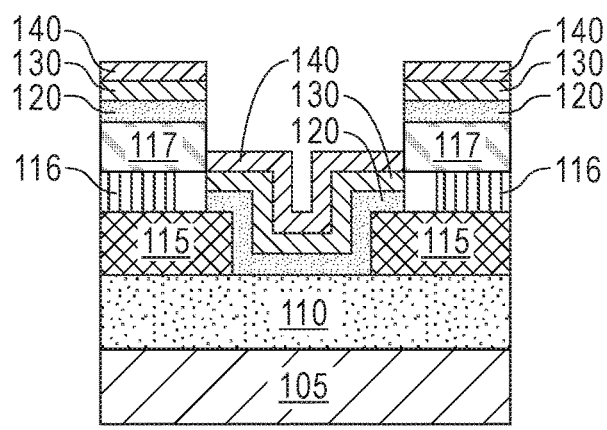

In the first embodiment, in FIG. 1E, a GST layer 130 is deposited on top of the Ag layer 120 and is in direct contact. In an embodiment, the GST layer 130 has a thickness less than 200 nm. In an alternative embodiment, the GST layer 130 has a thickness between 20 nm and 50 nm. In an embodiment, the GST layer 130 is deposited on the Ag layer 120 using physical sputtering and more specifically radio frequency (RF) sputtering. In an embodiment, a lift off layer 116 and a photoresist layer 117 are used in order to cover the patterned dielectric material layer 115 but expose the hole and an area around the hole in the patterned dielectric material layer 115 to the Ag layer 120 but does not allow for the entire remaining patterned dielectric material layer 115 to be covered in the GST layer 130. In an embodiment, the GST layer 130 covers the Ag layer 120 but does not cover any other layers. In an embodiment, as the GST layer 130 is deposited, the GST layer 130 intermixes with the Ag layer 120 forming a single layer (not shown) during the deposition of the various layers and due to thermal mixing, In the first embodiment, in FIG. 1F, a top electrode 140 is deposited on top of the GST layer 130 and is in direct contact. In an embodiment, a lift off layer 116 and a photoresists layer 117 are used in order to cover the patterned dielectric material layer 115 but expose the hole and an area around the hole to the top electrode 140. The top electrode 140 is composed of a second conductive material. The second conductive material that provides the top electrode 140 can be a conductive metal, or a conductive metal nitride. In one embodiment of the present application, the top electrode 140 can be composed of titanium nitride (TiN), tantalum nitride (TaN) or tungsten (W). In some embodiments, the second conductive material is a compositionally same conductive material as the first conductive material. In one example, both the bottom electrode 110 and the top electrode 140 are composed of titanium nitride (TiN). In other embodiments, the second conductive material is a compositionally different conductive material than the first conductive material. In one example, the bottom electrode 110 is composed of titanium nitride (TiN), and the top electrode 140 is composed of tantalum nitride (TaN). The top electrode 140 can have a thickness from 10 nm to 100 nm; although other thicknesses for the top electrode 140 are contemplated and can be employed in the present application. The top electrode 140 can be formed by a deposition process including, for example, chemical vapor deposition (CVD), plasma enhanced chemical vapor deposition (PECVD), atomic layer deposition (ALD), physical vapor deposition (PVD) or sputtering.

Figure 1G:
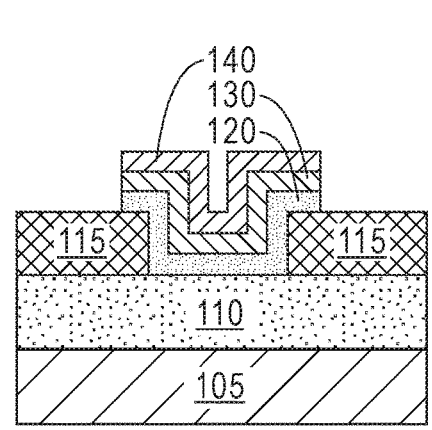

In the first embodiment, in FIG. 1G, upon completion of the deposition of the Ag layer 120, the GST layer 130, and the top electrode 140, the lift off layer 116 and photoresist layer 117 are dissolved by a chemical remover removing excess Ag layer 120, the GST layer 130, and top electrode 140.

Reference is now made to FIGS. 2A-2E, which illustrate a second method of forming a phase-change memory, in accordance with a second embodiment of the present invention. In the method, two Ag layers are deposited adjacent to a top electrode and a bottom electrode, respectively, with a doped Germanium Antimony Telluride (GST) layer between both of them and a patterned dielectric material layer between a top electrode and a bottom electrode between the bottom Ag layer and the first electrode. Referring to FIGS. 2A-2E, there is a pictorial representation (through a cross-sectional view) depicting a memory structure including a bottom electrode 210, a patterned dielectric layer 215, an Ag layer 220, a GST layer 230, an Ag layer 240 and a top electrode 250.

Figure 2A:
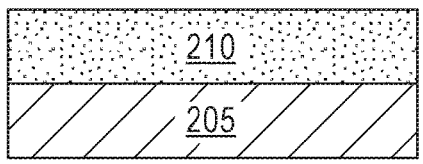
FIGS. 2A, 2B, 2C, 2D, 2E, 2F, 2G, and 2H are a pictorial representation (through a cross-sectional view) depicting a structure including two Ag layers and GST layer, in accordance with a second embodiment of the present invention.

In a second embodiment, FIG. 2A depicts the first layer of the memory structure, the substrate 205 with a bottom electrode 210 located on top of the substrate 205. In the second embodiment, substrate 205 is composed of conducting, non-conducting or semiconductor material (such as, for example, silicon). The bottom electrode 210 is composed of a first conductive material. The first conductive material that provides the bottom electrode 210 can be a conductive metal, or a conductive metal nitride. In one embodiment of the present application, the bottom electrode 210 can be composed of titanium nitride (TiN), tantalum nitride (TaN) or tungsten (W). The bottom electrode 210 can have a thickness from 10 nm to 100 nm; although other thicknesses for the bottom electrode 210 are contemplated and can be employed in the present application. The bottom electrode 210 can be formed by a deposition process including, for example, chemical vapor deposition (CVD), plasma enhanced chemical vapor deposition (PECVD), atomic layer deposition (ALD), physical vapor deposition (PVD) or sputtering, chemical solution or plating.

Figure 2B:
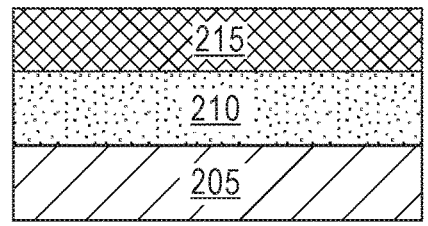

In a second embodiment, FIG. 2B depicts a blanket dielectric material layer 215 such as, for example, silicon dioxide or silicon nitride. The blanket dielectric material layer 215 can have a thickness from 10 nm to 100 nm; although other thicknesses for the blanket dielectric material layer 215 are contemplated and can be employed in the present application. The blanket dielectric material layer 215 can be formed by a deposition process including, for example, chemical vapor deposition (CVD), plasma enhanced chemical vapor deposition (PECVD), atomic layer deposition (ALD), physical vapor deposition (PVD) or sputtering.

Figure 2C:
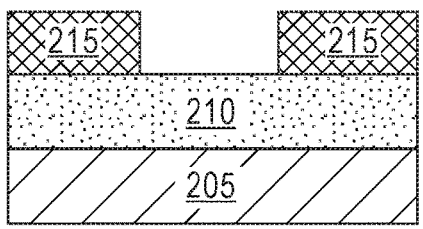

In a second embodiment, FIG. 2C depicts the dielectric material layer 215 of FIG. 2B that includes a hole of 1 micron or less of lateral dimension that is now referred to as the patterned dielectric material layer 215 that allows a layer to be placed on top of the patterned dielectric material layer 215 and this layer placed on top can be in contact with the bottom electrode 210. In an embodiment, there may be a single hole in the patterned dielectric material layer 215. In an alternative embodiment, there may be more than one hole in the patterned dielectric material layer 215. In yet another alterative embodiment, any of the holes may be located anywhere in the patterned dielectric material layer 215. In an embodiment, the holes are created by optical or electron beam lithography and/or reactive plasma etching.

Figure 2D:
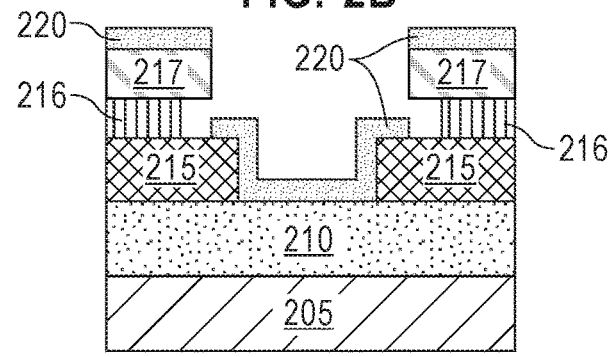

In a second embodiment, FIG. 2D, depicts an Ag layer 220 that is deposited on top of the patterned dielectric material layer 215 and the exposed layer of the bottom electrode 210 and is in direct contact with the bottom electrode. In an embodiment, the Ag layer 220 has a thickness less than 20 nm. In an alternative embodiment, the Ag layer 220 has a thickness between 5 nm and 10 nm. In an embodiment, the Ag layer 220 is deposited on the patterned dielectric material layer 215 using thermal evaporation. In an embodiment, a lift off layer 216 and a photoresists layer 217 are used in order to cover the patterned dielectric material layer 215 but expose the hole and an area around the hole in the patterned dielectric material layer 215 to the Ag layer 120 but does not allow for the entire remaining patterned dielectric material layer 215 to be covered in the Ag layer 220. In an embodiment, the lift off layer 216 and photoresist layer 217 are spin-on and baked. In an embodiment, the hole or holes is made by exposing UV light through a mask with the lithographic pattern aligned to the hole or holes in the patterned dielectric material layer and the lift off layer 216 is undercut by the developer.

Figure 2E:
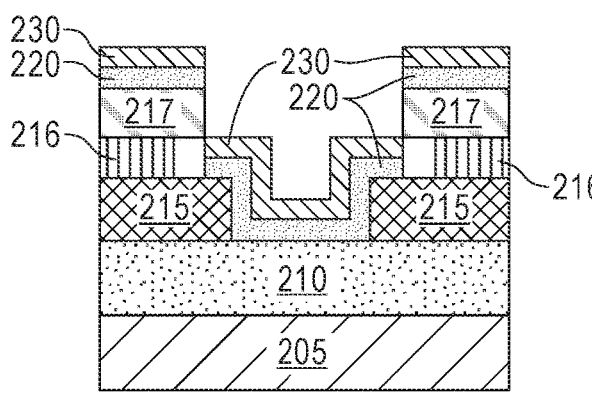
Figure 2F:
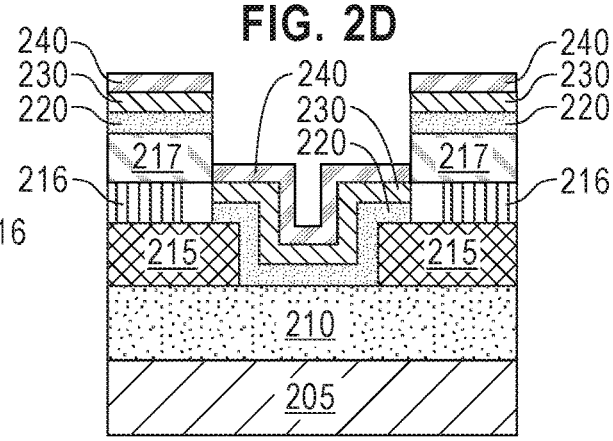

In a second embodiment, FIG. 2E, a GST layer 230 is deposited on top of the Ag layer 220 and is in direct contact. In an embodiment, the GST layer 230 has a thickness less than 200 nm. In an alternative embodiment, the GST layer 230 has a thickness between 20 nm and 50 nm. In an embodiment, the GST layer 230 is deposited on the Ag layer 220 using physical sputtering and more specifically radio frequency (RF) sputtering. In an embodiment, a lift off layer 216 and a photoresists layer 217 are used in order to cover the patterned dielectric material layer 215 but expose the hole and an area around the hole in the patterned dielectric material layer 215 to the Ag layer 220 but does not allow for the entire remaining patterned dielectric material layer 215 to be covered in the GST layer 230. In an embodiment, the GST layer 230 covers the Ag layer 220 but does not cover any other layers. In an embodiment, as the GST layer 230 is deposited, the GST layer 230 intermixes with the Ag layer 220 forming a single layer (not shown) during the deposition of the various layers and due to thermal mixing, In a second embodiment, FIG. 2F, an Ag layer 240 is deposited on top of the GST layer 230 and is in direct contact. In an embodiment, the Ag layer 240 has a thickness less than 20 nm. In an alternative embodiment, the Ag layer 240 has a thickness between 5 nm and 10 nm. In an embodiment, the Ag layer 240 is deposited on the GST layer 230 using thermal evaporation. In an embodiment, a lift off layer 216 and a photoresists layer 217 are used in order to cover the patterned dielectric material layer 115 but expose the GST layer 230. In an embodiment, as the Ag layer 240 is deposited, the Ag layer 240 intermixes with the GST layer 230 forming a single layer (not shown) during the deposition of the various layers and due to thermal mixing.

Figure 2G:
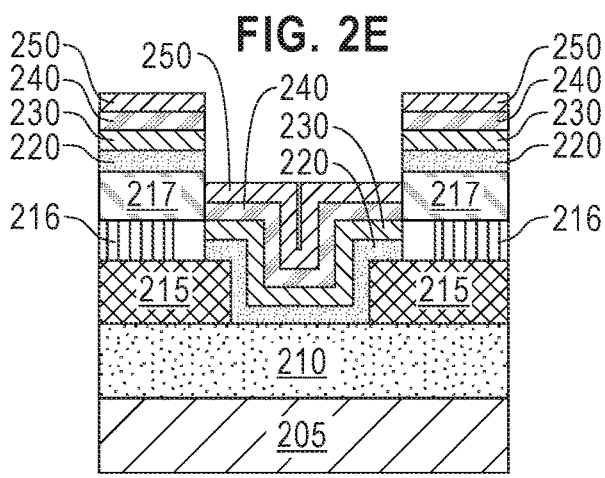
Figure 2H:
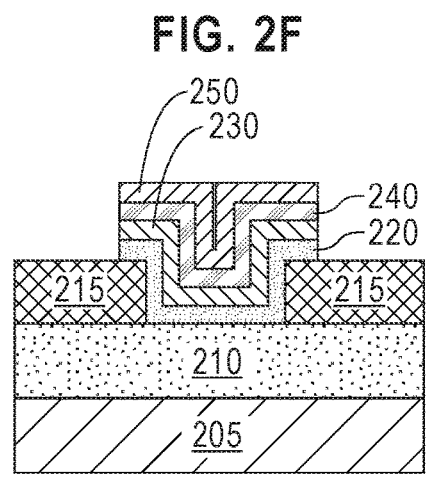

In an embodiment, FIG. 2G, a top electrode 250 is deposited on top of the layered structure composed by Ag 220, GST 230 and Ag 240 layers that is directly over the bottom electrode. In an embodiment, a lift off layer 216 and a photoresists layer 217 are used in order to cover the patterned dielectric material layer 215. The top electrode 250 is composed of a second conductive material. The second conductive material that provides top electrode 250 can be a conductive metal, or a conductive metal nitride. In one embodiment of the present application, the top electrode 250 can be composed of titanium nitride (TiN), tantalum nitride (TaN) or tungsten (W). In some embodiments, the second conductive material is a compositionally same conductive material as the first conductive material. In one example, both the bottom electrode 210 and the top electrode 250 are composed of titanium nitride (TiN). In other embodiments, the second conductive material is a compositionally different conductive material than the first conductive material. In one example, the bottom electrode 210 is composed of titanium nitride (TiN), and the top electrode 250 is composed of tantalum nitride (TaN). The top electrode 250 can have a thickness from 10 nm to 100 nm; although other thicknesses for the top electrode 250 are contemplated and can be employed in the present application. The top electrode 250 can be formed by a deposition process including, for example, chemical vapor deposition (CVD), plasma enhanced chemical vapor deposition (PECVD), atomic layer deposition (ALD), physical vapor deposition (PVD) or sputtering.

In the second embodiment, in FIG. 2E, upon completion of the deposition of the Ag layer 220, the GST layer 230, Ag layer 240, and top electrode 250, the lift off layer 216 and photoresist layer 217 are dissolved by a chemical remover removing excess Ag layer 220, the GST layer 230, Ag layer 240, and top electrode 250.

Reference is now made to FIGS. 3A-3G, which illustrate a third method of forming a phase-change memory, in accordance with a third embodiment of the present invention. In the third method, a Germanium Antimony Telluride (GST) layer is first deposited followed by an Ag layer and a top electrode layer. Referring to FIGS. 3A-3F, there is a pictorial representation (through a cross-sectional view) depicting a memory structure including a bottom electrode 310, a patterned dielectric layer 315, a GST layer 320, an Ag layer 330 and a top electrode 340.

Figure 3A:
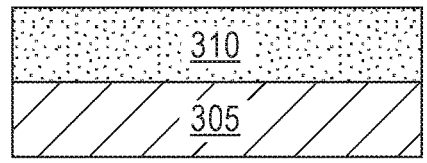
FIGS. 3A, 3B, 3C, 3D, 3E, 3F, and 3G are a pictorial representation (through a cross-sectional view) depicting a structure including an Ag and a GST layer, in accordance with a third embodiment of the present invention.

In the third embodiment, FIG. 3A depicts the first layer of the memory structure, the substrate 305 with a bottom electrode 310 located on top of the substrate 305. In the first embodiment, substrate 305 is composed of conducting, non-conducting or semiconductor material (such as, for example, silicon). The bottom electrode 310 is composed of a first conductive material. The first conductive material that provides the bottom electrode 310 can be a conductive metal, or a conductive metal nitride. In one embodiment of the present application, the bottom electrode 310 can be composed of titanium nitride (TiN), tantalum nitride (TaN) or tungsten (W). The bottom electrode 310 can have a thickness from 10 nm to 100 nm; although other thicknesses for the bottom electrode 310 are contemplated and can be employed in the present application. The bottom electrode 110 can be formed by a deposition process including, for example, chemical vapor deposition (CVD), plasma enhanced chemical vapor deposition (PECVD), atomic layer deposition (ALD), physical vapor deposition (PVD) or sputtering, chemical solution or plating.

Figure 3B:
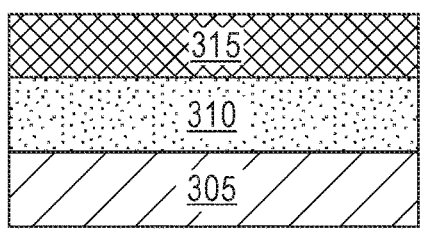

In the third embodiment, FIG. 3B depicts a blanket dielectric material layer 315 such as, for example, silicon dioxide or silicon nitride. The blanket dielectric material layer 315 can have a thickness from 10 nm to 100 nm; although other thicknesses for the blanket dielectric material layer 315 are contemplated and can be employed in the present application. The blanket dielectric material layer 315 can be formed by a deposition process including, for example, chemical vapor deposition (CVD), plasma enhanced chemical vapor deposition (PECVD), atomic layer deposition (ALD), physical vapor deposition (PVD) or sputtering.

Figure 3C:
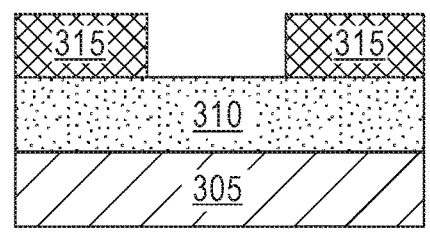

In the third embodiment, FIG. 3C depicts the dielectric material layer 315 of FIG. 3B that includes a hole of 1 micron or less of lateral dimension that is now referred to as the patterned dielectric material layer 315 that allows a layer to be placed on top of the patterned dielectric material layer 315 and this layer placed on top can be in contact with the bottom electrode 310. In an embodiment, there may be a single hole in the patterned dielectric material layer 315. In an alternative embodiment, there may be more than one hole in the patterned dielectric material layer 315. In yet another alterative embodiment, any of the holes may be located anywhere in the patterned dielectric material layer 315. In an embodiment, the holes are created by optical or electron beam lithography and reactive plasma etching or ion beam sputtering.

Figure 3D:
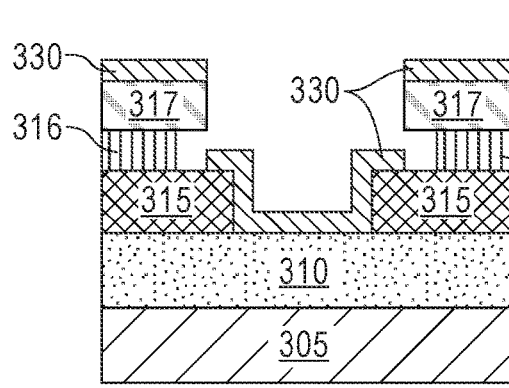

In the third embodiment, FIG. 3D, a GST layer 330 that is deposited on top of the patterned dielectric material layer 315 and the exposed layer of the bottom electrode 310 and is in direct contact. In an embodiment, the GST layer 330 has a thickness less than 200 nm. In an alternative embodiment, the GST layer 330 has a thickness between 20 nm and 50 nm. In an embodiment, the GST layer 330 is deposited on the patterned dielectric material layer 315 and the exposed layer of the bottom electrode 310 using physical sputtering and more specifically radio frequency (RF) sputtering. In an embodiment, a lift off layer 316 and a photoresists layer 317 are used in order to cover the patterned dielectric material layer 315 but expose the hole and an area around the hole in the patterned dielectric material layer 315 to the GST layer 330 but does not allow for the entire remaining patterned dielectric material layer 315 to be covered in the GST layer 330. In an embodiment, the lift off layer 316 and photoresist layer 317 are spin-on and baked. In an embodiment, the hole or holes is made by exposing UV light through a mask with the lithographic pattern aligned to the hole or holes in the patterned dielectric material layer and the lift off layer 316 is undercut by the developer.

Figure 3E:
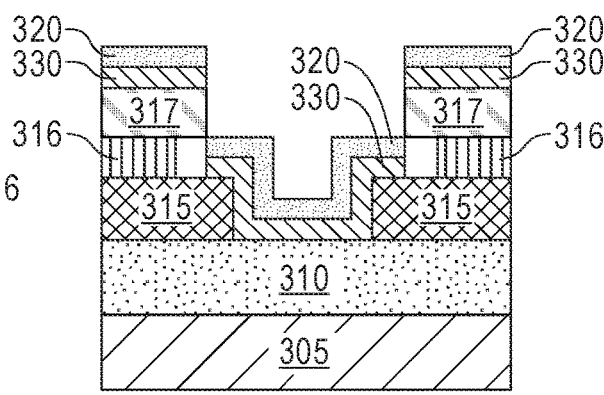
Figure 3F:
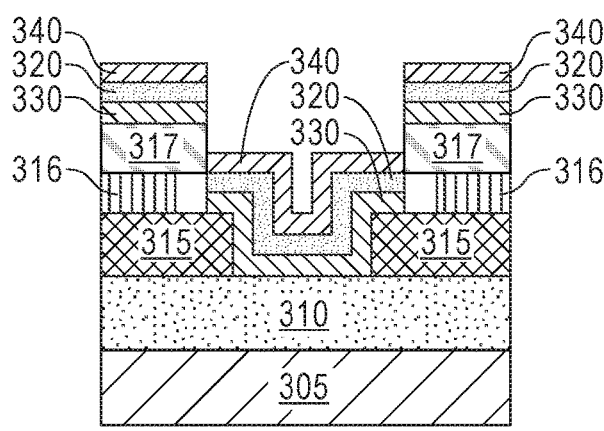

In the third embodiment, FIG. 3E, an Ag layer 320 is deposited on top GST layer 330 and is in direct contact. In an embodiment, the Ag layer 320 has a thickness less than 20 nm. In an alternative embodiment, the Ag layer 320 has a thickness between 5 nm and 10 nm. In an embodiment, the Ag layer 320 is deposited on the GST layer 330 using thermal evaporation. In an embodiment, a lift off layer 316 and a photoresists layer 317 are used in order to cover the patterned dielectric material layer 315 but expose the hole and an area around the hole in the patterned dielectric material layer 315 to the GST layer 330 but does not allow for the entire remaining patterned dielectric material layer 315 to be covered in the Ag layer 320. In an embodiment, the Ag layer 320 covers the GST layer 330 but does not cover any other layers. In an embodiment, as the GST layer 330 is deposited, the GST layer 130 intermixes with the Ag layer 320 forming a single layer (not shown) during the deposition of the various layers and due to thermal mixing, In the third embodiment, FIG. 3F, a top electrode 340 is deposited directly on top of the Ag layer 320. In an embodiment, a lift off layer 316 and a photoresists layer 317 are used in order to cover the patterned dielectric material layer 315 but expose the hole and an area around the hole to the top electrode 340. The top electrode 340 is composed of a second conductive material. The second conductive material that provides top electrode 340 can be a conductive metal, or a conductive metal nitride. In one embodiment of the present application, the top electrode 340 can be composed of titanium nitride (TiN), tantalum nitride (TaN) or tungsten (W). In some embodiments, the second conductive material is a compositionally same conductive material as the first conductive material. In one example, both the bottom electrode 310 and the top electrode 340 are composed of titanium nitride (TiN). In other embodiments, the second conductive material is a compositionally different conductive material than the first conductive material. In one example, the bottom electrode 310 is composed of titanium nitride (TiN), and the top electrode 340 is composed of tantalum nitride (TaN). The top electrode 340 can have a thickness from 10 nm to 100 nm; although other thicknesses for the top electrode 340 are contemplated and can be employed in the present application. The top electrode 340 can be formed by a deposition process including, for example, chemical vapor deposition (CVD), plasma enhanced chemical vapor deposition (PECVD), atomic layer deposition (ALD), physical vapor deposition (PVD) or sputtering.

Figure 3G:
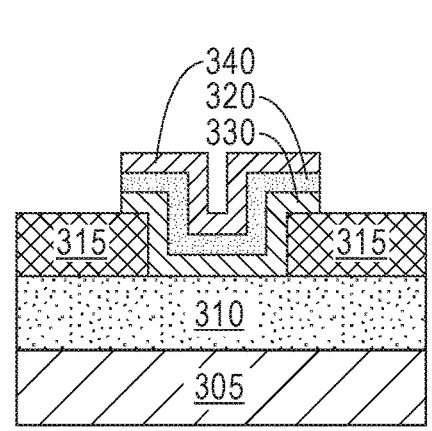

In the third embodiment, in FIG. 3G, upon completion of the deposition of the GST layer 330, the Ag layer 320, and top electrode 340, the lift off layer 316 and photoresist layer 317 are dissolved by a chemical remover removing excess GST layer 330, Ag layer 320, and top electrode 340.

Reference is now made to FIGS. 4A-4F, which illustrate a fourth method of forming a phase-change memory, in accordance with a fourth embodiment of the present invention. In the method, an Ag doped Germanium Antimony Telluride (GST) layer is deposited between a top electrode and a bottom electrode. Referring to FIGS. 4A-4E, there is a pictorial representation (through a cross-sectional view) depicting a memory structure including a bottom electrode 410, a patterned dielectric layer 415, an Ag doped GST layer 420, and a top electrode 440.

Figure 4A:
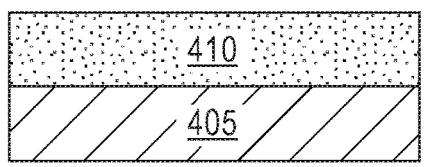
FIGS. 4A, 4B, 4C, 4D, 4E, and 4F are a pictorial representation (through a cross-sectional view) depicting a structure including an Ag doped GST layer, in accordance with a fourth embodiment of the present invention.

Even though not practiced here, the invention contemplates a fourth embodiment where an Ag-doped GST is used as the PCM material to address the reset resistance drift instead of a multi-layer structure of Ag and GST described above. FIG. 4A depicts the first layer of the memory structure, the substrate 405 with a bottom electrode 410 located on top of the substrate 405. In the fourth embodiment, substrate 405 is composed of conducting, non-conducting or semiconductor material (such as, for example, silicon). The bottom electrode 410 is composed of a first conductive material. The first conductive material that provides the bottom electrode 410 can be a conductive metal, or a conductive metal nitride. In one embodiment of the present application, the bottom electrode 410 can be composed of titanium nitride (TiN), tantalum nitride (TaN) or tungsten (W). The bottom electrode 410 can have a thickness from 10 nm to 100 nm; although other thicknesses for the bottom electrode 410 are contemplated and can be employed in the present application. The bottom electrode 410 can be formed by a deposition process including, for example, chemical vapor deposition (CVD), plasma enhanced chemical vapor deposition (PECVD), atomic layer deposition (ALD), physical vapor deposition (PVD) or sputtering, chemical solution or plating.

Figure 4B:
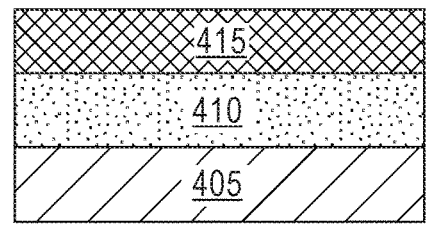

In the fourth embodiment, FIG. 4B depicts a blanket dielectric material layer 415 such as, for example, silicon dioxide or silicon nitride. The blanket dielectric material layer 415 can have a thickness from 10 nm to 100 nm; although other thicknesses for the blanket dielectric material layer 415 are contemplated and can be employed in the present application. The blanket dielectric material layer 415 can be formed by a deposition process including, for example, chemical vapor deposition (CVD), plasma enhanced chemical vapor deposition (PECVD), atomic layer deposition (ALD), physical vapor deposition (PVD) or sputtering.

Figure 4C:
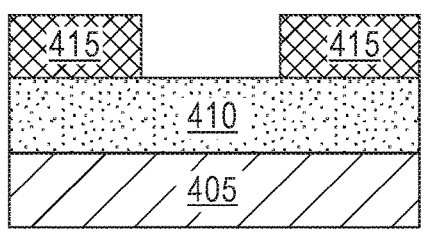

In the fourth embodiment, FIG. 4C depicts the dielectric material layer 415 of FIG. 4B that includes a hole of 1 micron or less of lateral dimension that is now referred to as the patterned dielectric material layer 415 that allows a layer to be placed on top of the patterned dielectric material layer 415 and this layer placed on top can be in contact with the bottom electrode 410. In an embodiment, there may be a single hole in the patterned dielectric material layer 415. In an alternative embodiment, there may be more than one hole in the patterned dielectric material layer 415. In yet another alterative embodiment, any of the holes may be located anywhere in the patterned dielectric material layer 415. In an embodiment, the holes are created by optical or electron beam lithography and/or reactive plasma etching.

Figure 4D:
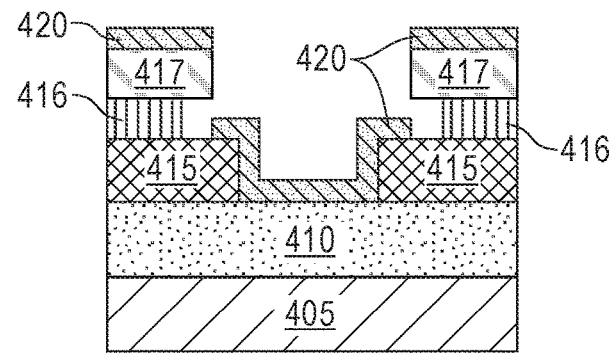

In the fourth embodiment, FIG. 4D, an Ag doped GST alloy layer 420 that is deposited on top of the bottom electrode 410 and is in direct contact. In an embodiment, the Ag doped GST layer 420 has a thickness less than 200 nm. The Ag doped GST alloy layer 420 is composed of GST alloy that contains (Ag) as an impurity (i.e., dopant) element. The impurity is present in the GST alloy in an amount sufficient to cause reduction of the reset state resistance drift of the PCM cell. In one embodiment of the present application, the Ag doped GST alloy layer 420 has a dopant concentration from 5 atomic percent to 15 atomic percent. In another embodiment of the present application, the Ag doped GST alloy layer 420 has a dopant concentration from 10 atomic percent to 45 atomic percent. An Ag dopant concentration from 5 atomic percent to 45 atomic percent in a GST alloy causes reduction of the reset state resistance drift of a PCM cell.

In some embodiments, the Ag doped GST alloy layer 420 has a uniform dopant concentration from one surface of the Ag doped GST alloy layer 420 to an opposing surface of the Ag doped GST alloy layer 420. In other embodiments, the Ag doped GST alloy layer 420 has a graded dopant concentration. In some embodiments, the graded dopant concentration decreases inward from both an interface formed between the bottom electrode 410 and the Ag doped GST alloy layer 420 and from an interface formed between the top electrode 440 and the Ag doped GST alloy layer 420.

In one embodiment, the Ag doped GST alloy layer 420 can be formed by first forming a non-Ag doped GST alloy layer. The non-Ag doped GST alloy layer can be formed utilizing a deposition process such as chemical vapor deposition (CVD), plasma enhanced chemical vapor deposition (PECVD), atomic layer deposition (ALD), or physical vapor deposition (PVD). Next, Ag ions can be introduced into the non-Ag doped GST alloy layer utilizing ion implantation, gas phase doping or dopant diffusion from a sacrificial material layer.

In another embodiment, the Ag doped GST alloy layer 420 can be formed utilizing a deposition process in which Ag ions or atoms are introduced during the deposition process itself.

In yet another embodiment, the Ag doped GST alloy layer 420 can be formed by first depositing a first layer of Ag, then depositing a non-Ag doped GST alloy layer, and thereafter depositing a second layer of Ag. During the deposition of the various layers and due to thermal mixing, the Ag-doped GST alloy layer is formed; no separate Ag layer remains, as shown and discussed above. In some embodiments, the first layer of Ag can be omitted. In other embodiments, the second layer of Ag can be omitted. The first layer of Ag and/or the second layer of Ag can be formed utilizing a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The non-Ag doped GST alloy layer can be formed utilizing a deposition process such as chemical vapor deposition (CVD), plasma enhanced chemical vapor deposition (PECVD), atomic layer deposition (ALD), or physical vapor deposition (PVD). In one embodiment and when the first and second layers of Ag are employed, the thickness of the first layer of Ag and the second layer of Ag can be from 3 nm to 15 nm, while the thickness of the non-Ag doped GST alloy layer can be from 20 nm to 150 nm.

In the fourth embodiment, FIG. 4D, an Ag doped GST layer 420 is deposited on top of the patterned dielectric material layer 415 and the exposed layer of the bottom electrode 410 and is in direct contact. In an embodiment, the Ag doped GST layer 420 has a thickness less 200 nm. In an alternative embodiment, the GST layer 420 has a thickness between 20 nm and 50 nm. In an embodiment, a lift off layer 416 and a photoresists layer 417 are used in order to cover the patterned dielectric material layer 415 but expose the hole and an area around the hole in the patterned dielectric material layer 415 to the Ag doped GST alloy layer 420 but does not allow for the entire remaining patterned dielectric material layer 415 to be covered in the Ag doped GST alloy layer 420. In an embodiment, the lift off layer 416 and photoresist layer 417 are spin-on and baked. In an embodiment, the hole or holes is made by exposing UV light through a mask with the lithographic pattern aligned to the hole or holes in the patterned dielectric material and the lift off layer 416 is undercut by the developer.

Figure 4E:
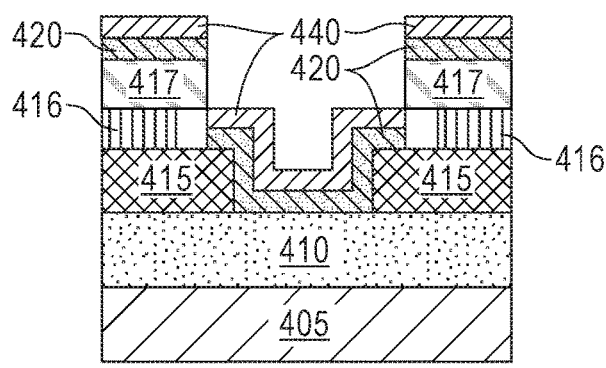

In the fourth embodiment, FIG. 4E, a top electrode 440 is deposited on top of the Ag doped GST alloy layer 420. In an embodiment, a lift off layer 416 and a photoresists layer 417 are used in order to cover the patterned dielectric material layer 415 but expose the hole and an area around the hole to the top electrode 440. The top electrode 440 is composed of a second conductive material. The second conductive material that provides top electrode 440 can be a conductive metal, or a conductive metal nitride. In one embodiment of the present application, the top electrode 440 can be composed of titanium nitride (TiN), tantalum nitride (TaN) or tungsten (W). In some embodiments, the second conductive material is a compositionally same conductive material as the first conductive material. In one example, both the bottom electrode 410 and the top electrode 440 are composed of titanium nitride (TiN). In other embodiments, the second conductive material is a compositionally different conductive material than the first conductive material. In one example, the bottom electrode 410 is composed of titanium nitride (TiN), and the top electrode 440 is composed of tantalum nitride (TaN). The top electrode 440 can have a thickness from 10 nm to 100 nm; although other thicknesses for the top electrode 440 are contemplated and can be employed in the present application. The top electrode 440 can be formed by a deposition process including, for example, chemical vapor deposition (CVD), plasma enhanced chemical vapor deposition (PECVD), atomic layer deposition (ALD), physical vapor deposition (PVD) or sputtering.

Figure 4F:
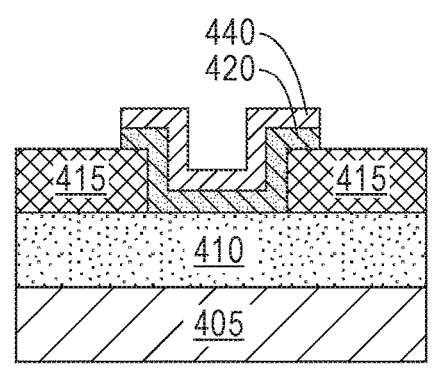

In the fourth embodiment, in FIG. 4F, upon completion of the deposition of the Ag doped GST alloy layer 420, and the top electrode 440, the lift off layer 416 and photoresist layer 417 are dissolved by a chemical remover removing excess Ag doped GST alloy layer 420 and top electrode 440.

In any of the four above described embodiments, the PCM structures can be formed into an array of PCM material stacks that are located between a first and second electrically conducive metal-containing structure forming a final structure. Here, the first electrically conductive metal-containing structure can be located on a substrate that may include a front-end-of-the-line (FEOL) level that contains one or more semiconductor devices located on, or in, a semiconductor substrate. Alternatively, the substrate may include a back-end-of-the line (BEOL) level located on a FEOL level. The BEOL level includes one or more interconnect levels that contain an interconnect dielectric material having one or more electrically conductive structures embedded therein.

In some embodiment, the final structure may also include a selector-containing layer located between each first electrically conductive metal-containing structure and each PCM stack. Each selector-containing layer includes, for example, a diode or a threshold switching device. Alternatively, the selector-containing layer can be omitted from the structure. The final structure can be formed utilizing processing techniques that are well known to those skilled in the art except for PCM material structures which are formed as described above in the four embodiments using Ag, GST, and/or Ag doped GST as the PCM material. Although not shown, the final structure can be embedded in one or more interconnect dielectric material layers that are formed upon a substrate.

What is claimed is:

1. A method for fabricating a phase-change memory (PCM), the method comprising:
    depositing a bottom electrode on top of a substrate;
    depositing a dielectric material layer on top of the bottom electrode;
    creating a hole in the dielectric material layer;
    spinning on and baking a lift off layer on the remaining dielectric material layer;
    spinning on and baking a photoresist layer on top of the lift off layer;
    performing UV lithography to create an opening above the hole in the dielectric material layer;
    depositing an Ag layer on top of the bottom electrode and on the remaining dielectric material layer and the photoresist layer;
    depositing a Germanium Antimony Telluride (GST) layer on top of the Ag layer;
    depositing a top electrode on top of the GST layer; and
    removing the Ag layer, the GST layer, and the top electrode stack located on top of the photoresist layer along with the photoresist layer and the lift off layer.

2. The method of claim 1, wherein during the deposition of the Ag layer and the GST layer both layers create an Ag-doped GST alloy layer by thermal mixing.

3. The method of claim 1, wherein the Ag layer has a thickness less than 20 nm.

4. The method of claim 1, wherein the Ag layer has a thickness between 5 nm and 10 nm.

5. The method of claim 1, wherein the GST layer has a thickness less than 200 nm.

6. The method of claim 1, wherein the GST layer has a thickness between 20 nm and 50 nm.

7. The method of claim 1, wherein the hole in the dielectric layer is 1 micron or less of lateral dimension.

8. A method for fabricating a phase-change memory (PCM), the method comprising:
depositing a bottom electrode on top of a substrate;
depositing a dielectric material layer on top of the bottom electrode;
creating a hole in the dielectric material layer;
spinning on and baking a lift off layer on the dielectric material layer with the hole;
spinning on and baking a photoresist layer on the lift off layer;
performing UV lithography to create an opening above the hole in the dielectric material layer;
depositing a first Ag layer on top of the bottom electrode and on the remaining dielectric material layer and the photoresist layer;
depositing a Germanium Antimony Telluride (GST) layer on top of the first Ag layer;
depositing a second Ag layer on top of the GST layer;
depositing a top electrode on top of the second Ag layer; and
removing the first Ag layer, the GST layer, the second Ag layer and the top electrode located on top of the photoresist layer along with the photoresist layer and the lift off layer.

9. The method of claim 8, wherein during the deposition of the first Ag layer, the GST layer, and the second Ag layer, all three layers can create an Ag-doped GST alloy layer by thermal mixing.

10. The method of claim 8, wherein the first Ag layer and the second Ag layer have a thickness less than 20 nm.

11. The method of claim 8, wherein the first Ag layer and the second Ag layer have a thickness between 5 nm and 10 nm.

12. The method of claim 8, wherein the GST layer has a thickness less than 200 nm.

13. The method of claim 8, wherein the GST layer has a thickness between 20 nm and 50 nm.

14. The method of claim 8, wherein the hole is 1 micron or less of lateral dimension.

15. A method for fabricating a phase-change memory (PCM), the method comprising:
depositing a bottom electrode on top of a substrate;
depositing a dielectric material layer on top of the bottom electrode;
creating a hole in the dielectric material layer;
spinning on and baking a lift off the dielectric material layer;
spinning on and baking a photoresist layer on the lift off layer;
performing UV lithography to create an opening above the hole in the dielectric material layer;
depositing a Germanium Antimony Telluride (GST) on top of the bottom electrode and on the remaining dielectric material layer and the photoresist layer;
depositing an Ag layer on top of the GST layer;
depositing a top electrode on top of the Ag layer; and
removing the GST layer, the Ag layer, and the top electrode located on top of the photoresist layer along with the photoresist layer and the lift off layer.

16. The method of claim 15, wherein during the deposition of the GST layer and the Ag layer both layers can create an Ag-doped GST alloy layer by thermal mixing.

17. The method of claim 15, wherein the Ag layer has a thickness less than 20 nm.

18. The method of claim 15, wherein the Ag layer has a thickness between 5 nm and 10 nm.

19. The method of claim 15, wherein the GST layer has a thickness less than 200 nm.

20. The method of claim 15, wherein the GST layer has a thickness between 20 nm and 50 nm.

* * * * *